US012593476B2

(12) United States Patent
Wu et al.

(10) Patent No.: US 12,593,476 B2
(45) Date of Patent: Mar. 31, 2026

(54) FIN FIELD-EFFECT TRANSISTOR DEVICE WITH HYBRID CONDUCTION MECHANISM

(71) Applicants: FUDAN UNIVERSITY, Shanghai (CN); SHANGHAI INTEGRATED CIRCUIT MANUFACTURING INNOVATION CENTER CO., LTD., Shanghai (CN)

(72) Inventors: Chunlei Wu, Shanghai (CN); Yumin Xu, Shanghai (CN); Boqian Shen, Shanghai (CN); Fei Zhao, Shanghai (CN); Zichen Yang, Shanghai (CN); Wei Zhang, Shanghai (CN); Min Xu, Shanghai (CN)

(73) Assignees: FUDAN UNIVERSITY, Shanghai (CN); SHANGHAI INTEGRATED CIRCUIT MANUFACTURING INNOVATION CENTER CO., LTD., Shanghai (CN)

( * ) Notice: Subject to any disclaimer, the term of this patent is extended or adjusted under 35 U.S.C. 154(b) by 388 days.

(21) Appl. No.: 18/552,180

(22) PCT Filed: Dec. 30, 2022

(86) PCT No.: PCT/CN2022/144160
§ 371 (c)(1),
(2) Date: Sep. 24, 2023

(87) PCT Pub. No.: WO2024/138688
PCT Pub. Date: Jul. 4, 2024

(65) Prior Publication Data
US 2025/0040196 A1       Jan. 30, 2025

(51) Int. Cl.
H10D 30/01        (2025.01)
H10D 30/62        (2025.01)
(Continued)

(52) U.S. Cl.
CPC ......... H10D 48/383 (2025.01); H10D 30/024 (2025.01); H10D 30/62 (2025.01);
(Continued)

(58) Field of Classification Search
CPC ............. H10D 30/024; H10D 30/6211; H10D 62/151; H10D 62/292; H10D 64/017; H10D 30/62; H10D 30/797
See application file for complete search history.

(56) References Cited

U.S. PATENT DOCUMENTS

2015/0206958 A1      7/2015   Walke et al.
2019/0319116 A1     10/2019   Lee et al.
(Continued)

FOREIGN PATENT DOCUMENTS

CN      102194884 A      9/2011
CN      105990410 A     10/2016
(Continued)

OTHER PUBLICATIONS

International Search Report, issued in PCT/CN2022/144160, dated Sep. 5, 2023.
(Continued)

*Primary Examiner* — David Vu
*Assistant Examiner* — Brandon C Fox
(74) *Attorney, Agent, or Firm* — Zhu Lehnhoff LLP

(57)        ABSTRACT

A fin field-effect transistor device with hybrid conduction mechanism, including a fin field-effect transistor, a second source region, and a second drain region; the fin field-effect transistor includes a substrate, a fin channel region, a first source region, and a first drain region; the height of the second source region is not lower than the height of the substrate between the first source region and the first drain region; the first source region the first drain region and the second drain region are doped with first ions; the second
(Continued)

source region is formed between the substrate and the first source region, the second drain region is formed between the substrate and the first drain region, the second source region is doped with second ions. This scheme can realize hybrid conduction of fin channel diffusion drift current and bottom channel band-to-band tunneling current, thus obtaining better ultra-steep switching characteristics.

20 Claims, 5 Drawing Sheets

(51) Int. Cl.
| | | |
|---|---|---|
| *H10D 30/69* | (2025.01) | |
| *H10D 48/00* | (2025.01) | |
| *H10D 62/13* | (2025.01) | |
| *H10D 62/17* | (2025.01) | |
| *H10D 64/01* | (2025.01) | |

(52) U.S. Cl.
CPC ....... *H10D 30/6211* (2025.01); *H10D 30/797* (2025.01); *H10D 62/151* (2025.01); *H10D 62/292* (2025.01); *H10D 64/017* (2025.01)

(56) References Cited

U.S. PATENT DOCUMENTS

| | | | | |
|---|---|---|---|---|
| 2020/0058771 | A1 | 2/2020 | Cheng et al. | |
| 2020/0266060 | A1* | 8/2020 | Cheng .................. | H10D 62/116 |
| 2024/0426895 | A1* | 12/2024 | Zhou .................... | G01R 27/205 |
| 2024/0429229 | A1* | 12/2024 | Wu ....................... | H10D 30/501 |
| 2025/0311319 | A1* | 10/2025 | Reboh ................... | H10D 84/85 |

FOREIGN PATENT DOCUMENTS

| | | | |
|---|---|---|---|
| CN | 106784005 A | 5/2017 | |
| CN | 108573869 A | 9/2018 | |
| CN | 109273524 A | 1/2019 | |
| CN | 114823668 A | 7/2022 | |

OTHER PUBLICATIONS

Written Opinion, issued in PCT/CN2022/144160, dated Sep. 5, 2023.
Examination Report, issued in CN202211730772.1 (priority application), by CNIPA, dated Jul. 4, 2025.

* cited by examiner

FIN FIELD-EFFECT TRANSISTOR DEVICE WITH HYBRID CONDUCTION MECHANISM

TECHNICAL FIELD

The present invention relates to a semiconductor device, in particular, to a fin field-effect transistor device with hybrid conduction mechanism.

BACKGROUND

Since the birth of integrated circuits, microelectronic integration technology has been continuously developing according to "Moore's Law". With the reduction of the size of Complementary Metal-Oxide-Semiconductor (CMOS) Field Effect Transistors (FETs), the switching speed, density, functionality, and cost of microprocessors have significantly improved. However, device power consumption is still one of the important challenges in the process of device size scaling. The main technical approach to reduce device power consumption is to enhance the gate control capability of the device. As a pioneer of three-dimensional integrated devices, Fin Field Effect Transistor (FinFET) has superior gate control capability compared to traditional planar gate devices due to its three-sided gate structure, making it the mainstream device structure for advanced logic devices. However, conventional FinFET devices have a significant sub-Fin leakage path under the fin channel, leading to an increase in the static power consumption of FinFET devices. How to suppress the off-state sub-Fin leakage current has become one of the key challenges in the optimization of fin devices.

Another effective method to reduce device power consumption is to reduce the power supply voltage VDD. The sub-threshold swing of traditional MOSFET devices is limited by the kT/q thermodynamic distribution, and there is a theoretical limit of 60 mV/dec under room temperature conditions, which makes it impossible for ULSI chips based on traditional MOSFET devices to continue to reduce the power supply voltage. Tunneling Field-Effect Transistor (TFET) has become one of the most potential device for future ultra-low power integrated circuit applications due to its excellent sub-threshold characteristics, smaller off-state leakage current, low switching power consumption and other excellent electrical characteristics. The conduction mechanism of the tunneling transistor is quantum mechanical band-to-band tunneling, which is not limited by thermodynamic temperature, and its sub-threshold swing can break the limit of 60 mV/dec at room temperature.

Therefore, the development of a fin field-effect transistor device that can effectively suppress the bottom leakage current and significantly improve the sub-threshold characteristics of the device has become a technical focus that needs to be solved by technical personnel in this field.

SUMMARY

The present invention provides a fin field-effect transistor device with hybrid conduction mechanism to solve the problem of bottom current leakage in fin field-effect transistors.

According to the first aspect of the present invention, a fin field-effect transistor device with hybrid conduction mechanism is provided, which includes:

a fin field-effect transistor, which includes a substrate, a fin channel region, a first source region and a first drain region; the first source region and the first drain region are arranged along a first direction above the substrate; the fin channel region is formed on the substrate between the first source region and the first drain region; wherein, the first source region and the first drain region are doped with first ions; wherein, the first direction represents the channel direction of the fin field-effect transistor;

a second source region and a second drain region, the second source region is formed between the substrate and the first source region, the second drain region is formed between the substrate and the first drain region; the height of the second source region and the height of the second drain region are not lower than the height of the substrate between the first source region and the first drain region:

wherein, the second drain region is doped with the first ions, the second source region is doped with second ions, and the type of the first ions is different from the type of the second ions.

Optionally, the thickness of the second source region and/or the second drain region is 5 nm-50 nm.

Optionally, the first ions are P-type ions or N-type ions.

Optionally, the second ions are P-type ions or N-type ions.

Optionally, the ion concentration doped in the second source region and/or the second drain region is 1E16 $cm^{-3}$-1E22 $cm^{-3}$ Optionally, the material of the second source region and the material of the second drain region are binary or ternary compounds of group II-VI, group III-V, or group IV-IV.

Optionally, the material of the second source region and the material of the second drain region are Si, SiGe or Ge.

Optionally, the fin field-effect transistor further includes:

a gate dielectric layer and a control gate, the gate dielectric layer wraps part of the surface of the channel layer, and wraps the substrate between the first source region and the first drain region; the control gate wraps the surface of the gate dielectric layer;

a sidewall, formed on both sides of the gate dielectric layer and the control gate along the first direction;

a source metal layer, a gate metal layer, and a drain metal layer; the source metal layer and the drain metal layer are respectively formed on the surfaces of the first source region and the first drain region, and fully wrapped the first source region and the second source region, and the first drain region and the second source region, respectively; the gate metal layer is formed at the top of the control gate;

a interlayer dielectric layer, covering the surfaces of the source metal layer, the gate metal layer, the drain metal layer, and the sidewall;

a metal contact layer, penetrating the interlayer dielectric layer, and is respectively connected to the source metal layer, the gate metal layer, and the drain metal layer.

According to the second aspect of the present invention, a method for manufacturing a fin field-effect transistor device with hybrid conduction mechanism is provided, which is used for manufacturing the fin field-effect transistor device with hybrid conduction mechanism according to any one of the first aspect of the present invention, including:

forming the fin field-effect transistor, the second source region, and the second drain region; wherein, the fin field-effect transistor includes the substrate, the fin channel region, the first source region and the first drain region; the first source region and the first drain region are arranged along the first direction above the substrate; the fin channel region is formed on the substrate between the first source region and the first drain region; the second source region is formed between the substrate and the first source region, the second drain region is formed between the substrate and the first drain region, wherein, the first source region, the first drain region, and the second drain region are doped with the first ions; the second source region is doped with second ions, and the type of the first ions is different from the type of the second ions.

Optionally, the forming the fin field-effect transistor, the second source region and the second drain region, specifically includes:

providing the substrate;

forming a dummy gate structure and the sidewall; the dummy gate structure straddles the substrate; the sidewall are closely attached to the two sides of the dummy gate structure along the first direction;

etching the substrate on both sides of the sidewall along the first direction to form the fin channel region, and over-etching the substrate on both sides of the sidewall along the first direction to form a first cavity and a second cavity; wherein, the dummy gate structure and the sidewall wrap the fin channel region; the first cavity and the second cavity are arranged in sequence along the first direction;

forming the second source region and the second drain region; the second source region is formed in the first cavity, and the second drain region is formed in the second cavity;

forming the first source region and the first drain region; the first source region and the first drain region are respectively formed at the top ends of the second source region and the second drain region;

removing the dummy gate structure;

forming the gate dielectric layer, the control gate, the source metal layer, the gate metal layer, the drain metal layer, the interlayer dielectric layer, and the metal contact layer.

Optionally, the forming the second source region and the second drain region, specifically includes:

forming a patterned first mask layer; the patterned first mask layer covers the second cavity, the dummy gate structure, and the surface of the sidewall;

filling the material of the second source region in the first cavity to form the second source region, and then removing the patterned first mask layer;

forming a patterned second mask layer; the patterned second mask layer covers the second source region, the dummy gate structure, and the surface of the sidewall;

filling the material of the second drain region in the second cavity to form the second drain region, and then removing the patterned second mask layer.

According to the third aspect of the present invention, an electronic device is provided, comprising the fin field-effect transistor device with hybrid conduction mechanism according to any one of the first aspect of the present invention.

According to a fourth aspect of the present invention, a method for manufacturing an electronic device is provided, comprising the method for manufacturing a fin field-effect transistor device with hybrid conduction mechanism as described in any one of the second aspect of the present invention.

Compared with the existing fin field-effect transistor, the fin field-effect transistor device with hybrid conduction mechanism provided by the present invention sets a second source region and a second drain region respectively between the first source region and the substrate, and between the first drain region and the substrate. The second drain region is doped with first ions, and the second source region is doped with second ions, and the type of the first ions is different from the type of the second ions. In the off state, a reverse-biased P-I-N channel is formed at the bottom, which can significantly suppress the leakage of bottom current, thereby enhancing the current switch ratio of the device.

Furthermore, due to the addition of the second source region and the second drain region, which is equivalent to that the bottom of the fin field-effect transistor being connected in parallel with a tunneling field effect transistor device structure, therefore, when in the on state, the fin field-effect transistor device with hybrid conduction mechanism provided by the present invention can realize the hybrid conduction of the fin channel diffusion drift current and the bottom channel quantum mechanical band-to-band tunneling current, thus the entire device can obtain ultra-steep switching characteristics below 60 mV/dec. At the same time, in the on state, the fin field-effect transistor device in parallel above is turned on, which can provide a large current for the device.

BRIEF DESCRIPTION OF DRAWINGS

In order to illustrate the technical solutions in the embodiments according to the present disclosure or in the prior art more clearly, a brief introduction may be given hereinafter to the accompany drawings required to be used in the description of the embodiments or the prior art. Apparently, the accompany drawings in the description below are merely some embodiments of the present disclosure, and other accompany drawings may be obtained by those of ordinary skilled in the art according to these accompany drawings without paying any creative labor.

DESCRIPTION OF REFERENCE SIGNS

Figure 1:
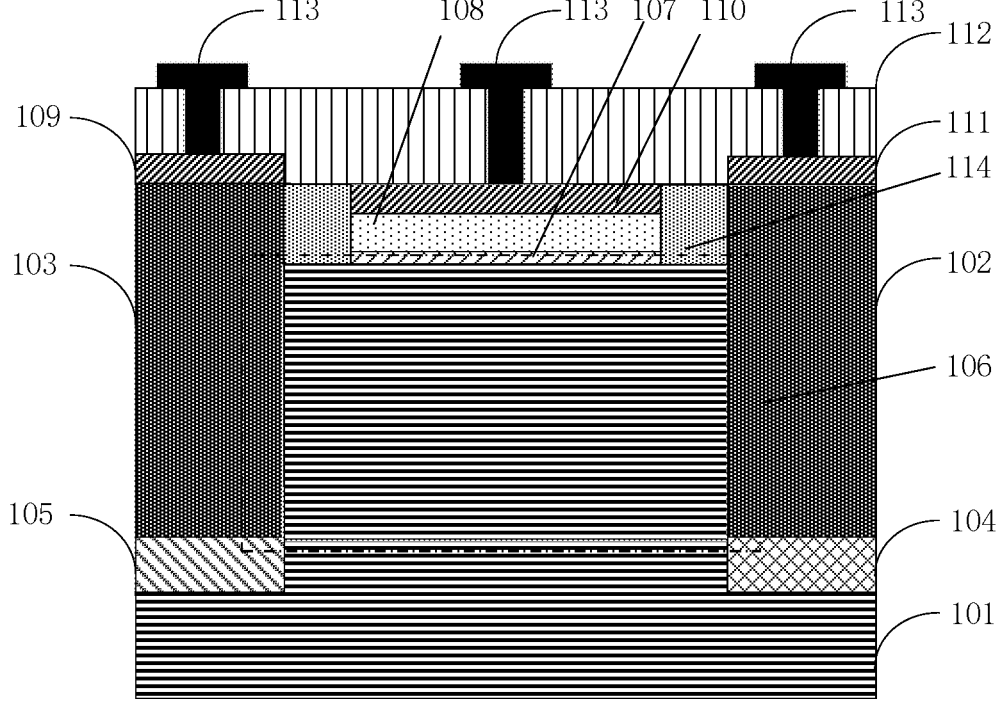
FIG. 1 is a front view schematic diagram of a fin field-effect transistor device with hybrid conduction mechanism in an embodiment of the present disclosure.

101—Substrate;
102—First source region;
103—First drain region;
104—Second source region;
105—Second drain region;
106—Fin channel region;
107—Gate dielectric layer;
108—Control gate;
109—Drain metal layer;
110—Gate metal layer;

111—Source metal layer;
112—Interlayer dielectric layer;
113—Metal contact layer;
114—Sidewall;
115—Dummy gate structure;
116—Photoresist;
117—STI structure.

DESCRIPTION OF EMBODIMENTS

The following clearly and completely describes the technical solutions in the embodiments of the present invention with reference to the accompanying drawings in the embodiments of the present invention. Obviously, the described embodiments are merely some but not all of embodiments of the present invention. Based on the embodiments of the present invention, all other embodiments obtained by those of ordinary skill in the art without creative efforts should fall within the protection scope of the present invention.

In the specification, claims and accompanying drawings of the present invention, the terms "first", "second", "third", "fourth" and so on (if any) are intended to distinguish between similar objects but do not necessarily indicate a specific order or sequence. It should be understood that the terms so used may be interchanged where appropriate, so that the embodiments described herein can be implemented in a sequence other than what is illustrated or described herein. Furthermore, the terms "comprise" and "include" and any variations thereof are intended to cover a non-exclusive inclusion, such that a process, method, system, product or apparatus that includes a list of steps or units does not include only those steps or units, but may include other steps or units not explicitly listed or inherent to such process, method, product or apparatus.

Since conventional FinFET devices have a significant sub-Fin leakage path under the fin channel, leading to an increase in the static power consumption of FinFET devices, how to suppress the off-state sub-Fin leakage current has become one of the key challenges in the optimization of fin devices. The sub-threshold swing of traditional MOSFET devices is limited by the kT/q thermodynamic distribution, and there is a theoretical limit of 60 mV/dec under room temperature conditions, which makes it impossible for ULSI chips based on traditional MOSFET devices to continue to reduce the power supply voltage.

In view of this, the inventors of this application, by adding a source region and a drain region at the bottom, form a structure similar to a tunneling transistor at the bottom of the fin field-effect transistor; the hybrid conduction mechanism fin field-effect transistor combining tunneling transistor and fin field-effect transistor can effectively suppress the bottom leakage current and significantly improve the sub-threshold characteristics of the device.

The technical solutions of the present invention will be described in detail with specific embodiments. The following specific embodiments can be combined with each other, and for the same or similar concepts or processes, some embodiments may not be repeated.

Please refer to FIG. 1 to FIG. 5, according to an embodiment of the present invention, a fin field-effect transistor device with hybrid conduction mechanism is provided, which includes: a fin field-effect transistor, a second source region 104 and a second drain region 105.

The fin field-effect transistor includes a substrate 101, a fin channel region 106, a first source region 102, and a first drain region 103; the first source region 102 and the first drain region 103 are arranged above the substrate 101 in a first direction; the fin channel region 106 is formed on the substrate 101 between the first source region 102 and the first drain region 103; wherein, the first source region 102 and the first drain region 103 are doped with first ions; wherein, the first direction represents the channel direction of the fin field-effect transistor.

In a specific embodiment, the substrate 101 is selected from bulk silicon Si, silicon-on-insulator SOI, Ge, germanium-on-insulator GOI, SiGe or other semiconductor materials.

The second source region 104 is formed between the substrate 101 and the first source region 102, and the second drain region 105 is formed between the substrate 101 and the first drain region 103; the height of the second source region 104 and the second drain region 105 is not lower than the height of the substrate 101 between the first source region 102 and the first drain region 103.

Figure 3:
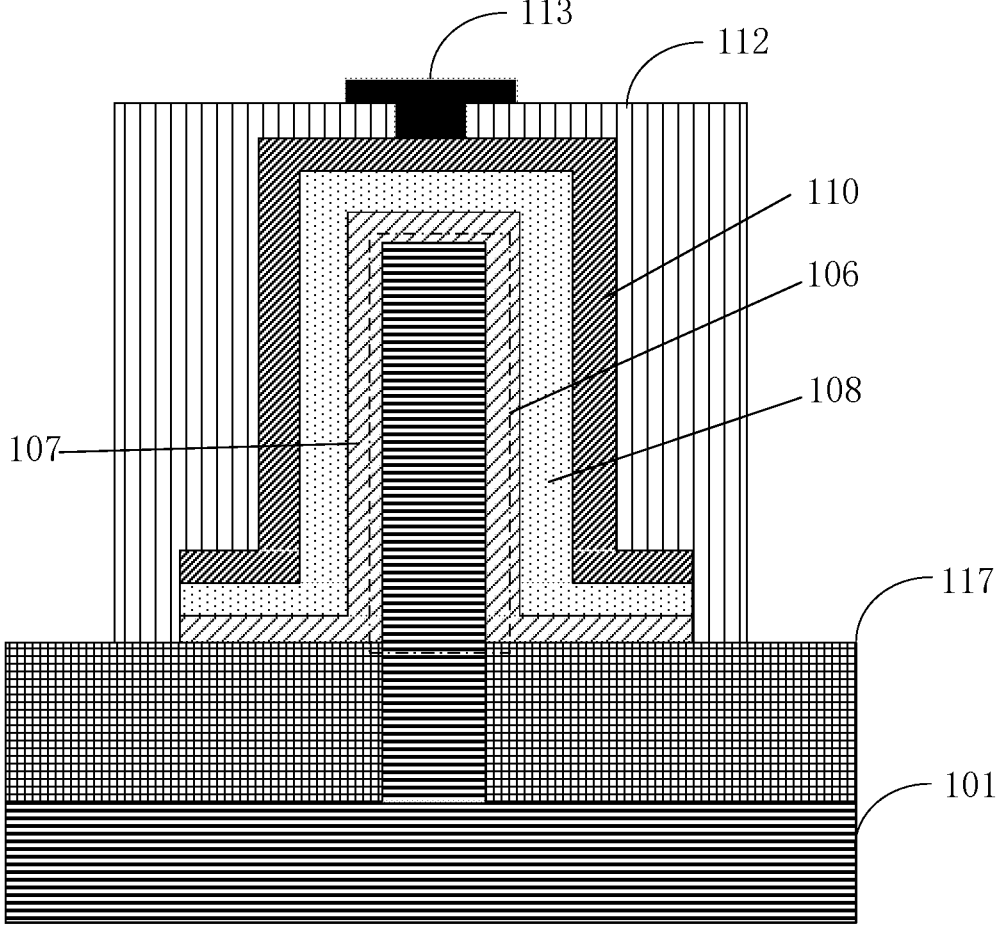
FIG. 3 is a side view schematic diagram of a fin field-effect transistor device with hybrid conduction mechanism in an embodiment of the present disclosure.

Wherein, the second drain region 105 is doped with the first ions, the second source region 104 is doped with second ions, and the type of the first ions is different from the type of the second ions. The front view schematic diagram of the fin field-effect transistor device with hybrid conduction mechanism is shown in FIG. 1, and the side view schematic diagram of the fin field-effect transistor device with hybrid conduction mechanism is shown in FIG. 3.

Compared with the existing fin field-effect transistor, the fin field-effect transistor device with hybrid conduction mechanism provided by the present invention sets a second source region and a second drain region respectively between the first source region and the substrate, and between the first drain region and the substrate. The second drain region is doped with first ions, and the second source region is doped with second ions, and the type of the first ions is different from the type of the second ions. In the off state, a reverse-biased P-I-N channel is formed at the bottom, which can significantly suppress the leakage of bottom current, thereby enhancing the current switch ratio of the device.

Furthermore, due to the addition of the second source region and the second drain region, which is equivalent to that the bottom of the fin field-effect transistor being connected in parallel with a tunneling field effect transistor device structure, therefore, when in the on state, the fin field-effect transistor device with hybrid conduction mechanism provided by the present invention can realize the hybrid conduction of the fin channel diffusion drift current and the bottom channel quantum mechanical band-to-band tunneling current, thus the entire device can obtain ultra-steep switching characteristics below 60 mV/dec. At the same time, in the on state, the fin field-effect transistor device in parallel above is turned on, which can provide a large current for the device.

In one embodiment, the first ions are P-type ions or N-type ions.

In one embodiment, the second ions are P-type ions or N-type ions.

Specifically, the P-type ions are: hydrides, fluorides, or chlorides of boron, specifically one or a combination of the following materials: $B_2H_6$, $B_4H_{10}$, $B_6H_{10}$, $B_{10}H_{14}$, $B_{18}H_{22}$, $BF_3$ or $BCl_3$; N-type ions are: hydrides, fluorides of phosphorus and arsenic, specifically one or a combination of the following materials: phosphine, arsine, phosphorus pentafluoride, phosphorus trifluoride, arsenic pentafluoride or arsenic trifluoride.

The fin channel region 106 and the bottom fin region (that is, the substrate 101 between the second source region 104 and the second drain region 105) are undoped or lightly doped i regions; the range of light doping in the bottom fin region is: 1E13 $cm^{-3}$-1E15 $cm^{-3}$.

For N-type devices, the first source region 102 is N-type doped, with a doping concentration of about 1E18 $cm^{-3}$-1E22 $cm^{-3}$, the first drain region 103 is N-type doped, with a doping concentration of about 1E18 $cm^{-3}$-1E22 $cm^{-3}$, the second source region 104 is P-type doped, with a doping concentration of about 1E18 $cm^{-3}$-1E22 $cm^{-3}$, the second drain region 105 is N-type doped, with a doping concentration of about 1E16 $cm^{-3}$-1E21 $cm^{-3}$.

For P-type devices, the first source region 102 is P-type doped, with a doping concentration of about 1E18 $cm^{-3}$-1E22 $cm^{-3}$, the first drain region 103 is P-type doped, with a doping concentration of about 1E18 $cm^{-3}$-1E20 $cm^{-3}$, the second source region 104 is N-type doped, with a doping concentration of about 1E18 $cm^{-3}$-1E22 $cm^{-3}$, the second drain region 105 is P-type doped, with a doping concentration of about 1E16 $cm^{-3}$-1E21 $cm^{-3}$.

In the fin field-effect transistor device with hybrid conduction mechanism, the thickness and doping concentration of the second source region and the second drain region are important parameters in device design. If the thickness of the second source region or the second drain region is too thin, the influence of the bottom tunneling field effect transistor on the total current is small, and the improvement of the sub-threshold swing characteristics of the device is limited; if the thickness of the second source region or the second drain region is too thick, it will increase the difficulty of the process and cause the consistency and reliability of the device to decrease. The doping concentration of the second source region cannot be too low; too low doping concentration will increase the resistance of the second source region, and at the same time, the lower doping reduces the tunneling probability of the bottom tunneling transistor, making band-to-band tunneling more difficult to occur and resulting in a decrease in current. The doping concentration of the second drain region also needs to be controlled within a certain range. If the doping concentration is too low, it will increase the resistance of the bottom drain region and decrease the current; if the doping concentration is too high, it will make the bipolar effect of the TFET device channel more significant.

In a preferred embodiment, the thickness of the second source region 104 and/or the second drain region 105 is 5 nm-50 nm. In one embodiment, the ion concentration doped in the second source region 104 and/or the second drain region 105 is 1E16 $cm^{-3}$-1E22 $cm^{-3}$.

In a preferred embodiment, the material of the second source region and the material of the second drain region are binary or ternary compounds of group II-VI, group III-V, or group IV-IV.

In one embodiment, the material of the second source region and the material of the second drain region are Si, SiGe, or Ge.

In one embodiment, the fin field-effect transistor also includes:

a gate dielectric layer 107 and a control gate 108, the gate dielectric layer 107 wraps part of the surface of the channel layer, and wraps the substrate 101 between the first source region 102 and the first drain region 103; the control gate 108 wraps the surface of the gate dielectric layer 107;

a sidewall 114, formed on both sides of the gate dielectric layer 107 and the control gate 108 in the first direction;

a source metal layer 111, a gate metal layer 110, and a drain metal layer 109;

in one implementation, the source metal layer 111 and the drain metal layer 109 are respectively formed on the surfaces of the first source region 102 and the first drain region 103, and fully wrap the first source region 102 and the first drain region 103; the gate metal layer 110 is formed on the top of the control gate 108;

due to the additional parasitic resistance caused by the second source and drain regions, which is not conducive to the steep sub-threshold swing characteristics of the device, therefore, in a preferred implementation, the source metal layer 111 and the drain metal layer 109 are respectively formed on the surfaces of the first source region 102 and the first drain region 103, and respectively fully wrap the first source region 102 and the second source region 104, and the first drain region 103 and the second drain region 105; the gate metal layer 110 is formed on the top of the control gate 108;

a interlayer dielectric layer 112, covering the surfaces of the source metal layer 111, the gate metal layer 110, the drain metal layer 109, and the sidewall 114;

a metal contact layer 113, penetrating the interlayer dielectric layer 112, and is respectively connected to the source metal layer 111, the gate metal layer 110, and the drain metal layer 109.

According to other embodiments of the present invention, a method for manufacturing a fin field-effect transistor device with hybrid conduction mechanism is also provided, which is used to manufacture any of the fin field-effect transistor device with hybrid conduction mechanism described in the aforementioned embodiments of the present invention, including: forming the fin field-effect transistor, the second source region 104, and the second drain region 105; wherein, the fin field-effect transistor includes the substrate 101, the fin channel region 106, the first source region 102, and the first drain region 103; the first source region 102 and the first drain region 103 are arranged above the substrate 101 in the first direction; the fin channel region 106 is formed on the substrate 101 between the first source region 102 and the first drain region 103; the second source region 104 is formed between the substrate 101 and the first source region 102, and the second drain region 105 is formed between the substrate 101 and the first drain region 103;

wherein, the first source region 102, the first drain region 103, and the second drain region 105 are doped with the first ions; the second source region 104 is doped with the second ions, and the type of the first ions is different from the type of the second ions.

Figure 2:
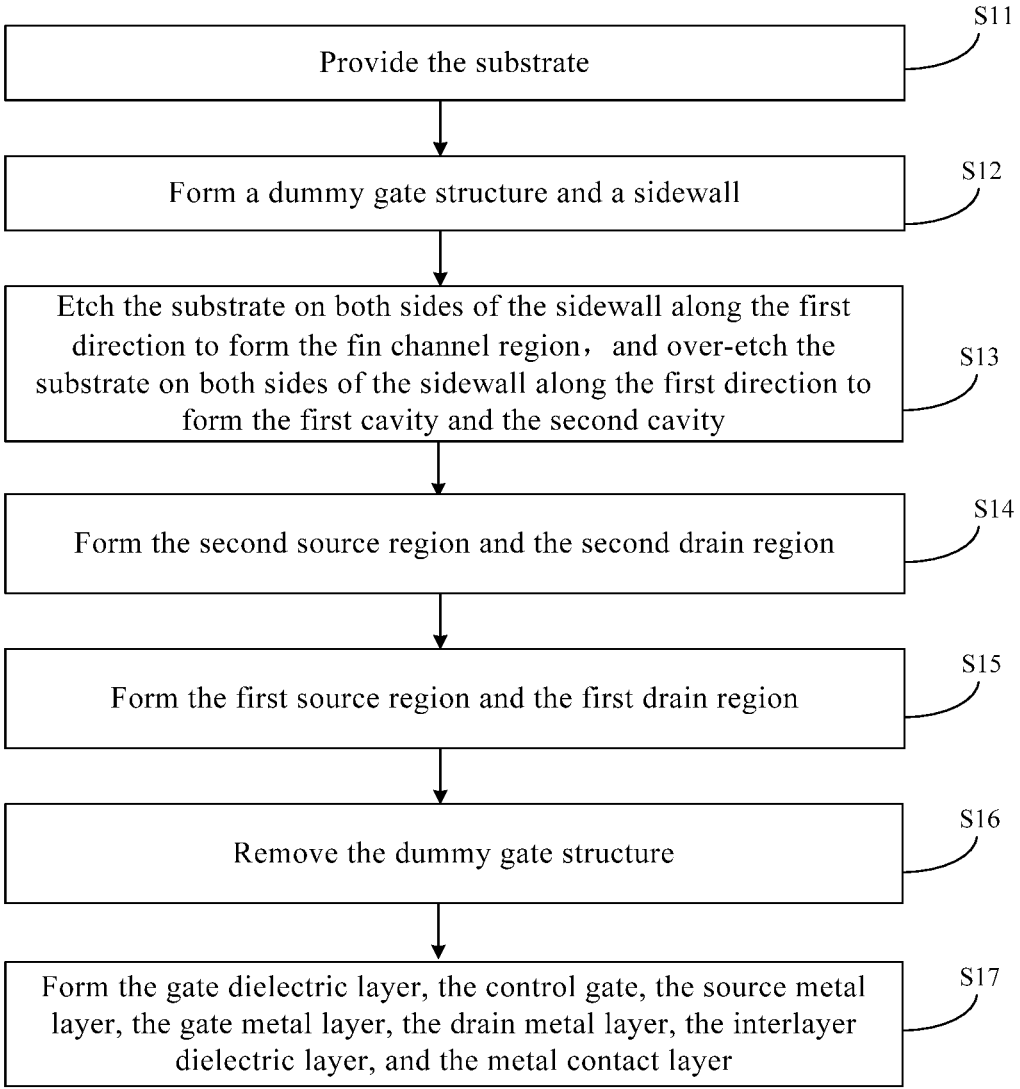
FIG. 2 is a flowchart of a method for manufacturing a fin field-effect transistor device with hybrid conduction mechanism in an embodiment of the present disclosure.
Figure 4:
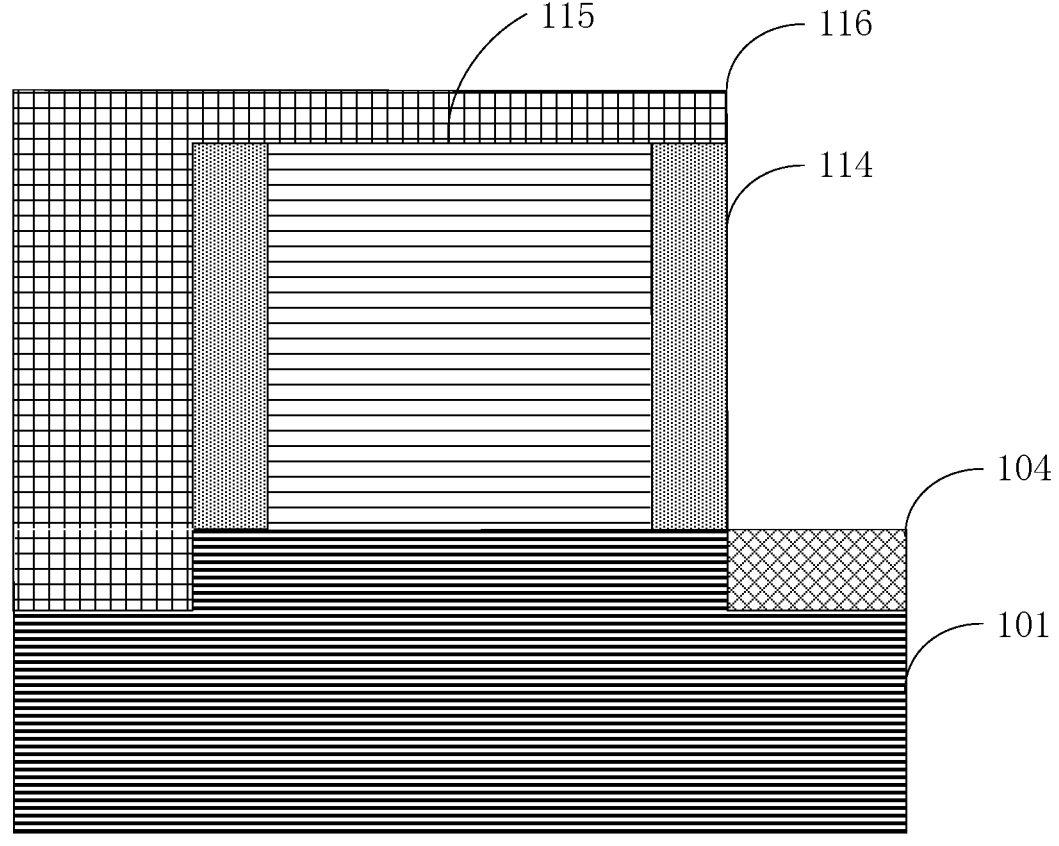
FIG. 4 is a first schematic diagram of a device structure at different process stages manufactured according to a method for manufacturing a fin field-effect transistor device with hybrid conduction mechanism in a first embodiment of the present disclosure.
Figure 5:
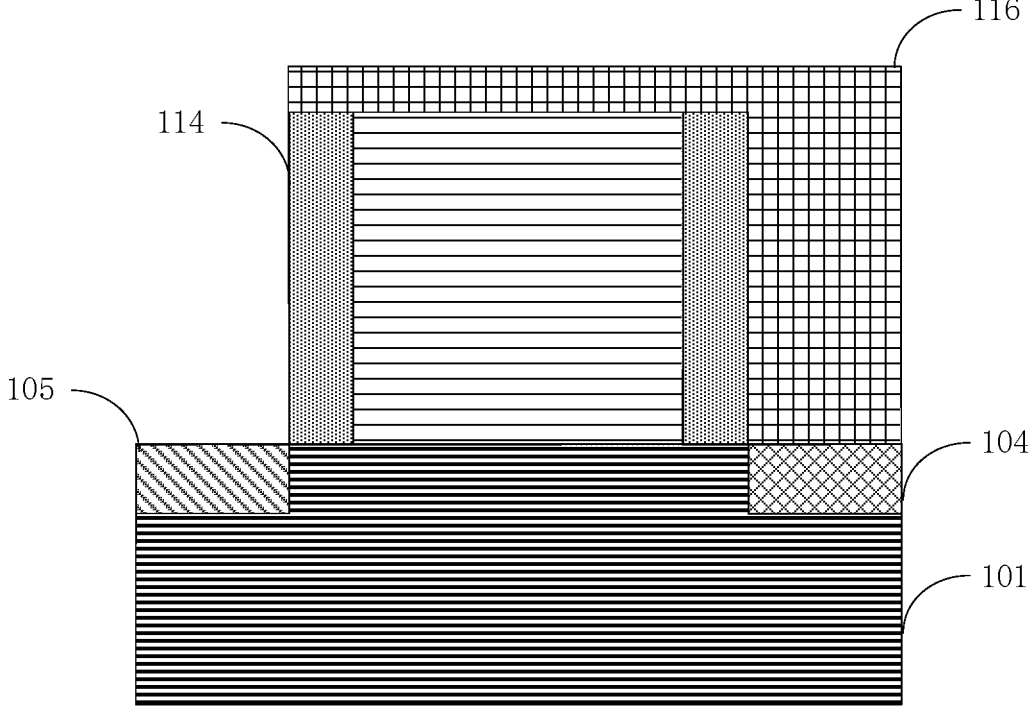
FIG. 5 is a second schematic diagram of a device structure at different process stages manufactured according to a method for manufacturing a fin field-effect transistor device with hybrid conduction mechanism in a second embodiment of the present disclosure.

In one embodiment, as shown in FIG. 2, forming the fin field-effect transistor, the second source region 104, and the second drain region 105, specifically including:

S11: Provide the substrate 101; and form an STI structure 117 by using lithography for STI isolation patterning; wherein, the depth of lithography is about 5 nm-50 nm, and the material of the STI structure is SiO2;

S12: Form a dummy gate structure 115 and a sidewall 114; the dummy gate structure 115 straddles the substrate 101; the sidewall 114 are closely attached to the two sides of the dummy gate structure 115 along the first direction; specifically, the material of the dummy gate structure 115 is polysilicon; the method used to form the dummy gate structure 115 is: atomic layer deposition, chemical vapor deposition, or physical vapor deposition; the thickness of the dummy gate structure 115 is 50 nm;

S13: Etch the substrate 101 on both sides of the sidewall 114 along the first direction to form the fin channel region 106, control the length of the device channel to be about 50 nm-100 nm, and over-etch the substrate 101 on both sides of the sidewall 114 along the first direction to form the first cavity and the second cavity; wherein, the dummy gate structure 115 and the sidewall 114 wrap the fin channel region 106; the first cavity and the second cavity are arranged in sequence along the first direction;

S14: Form the second source region 104 and the second drain region 105; the second source region 104 is formed in the first cavity, and the second drain region 105 is formed in the second cavity;

In one embodiment, forming the second source region 104 and the second drain region 105 in step S14, specifically includes:

S141: Form a patterned first mask layer; the patterned first mask layer covers the second cavity, the dummy gate structure 115, and the surface of the sidewall 114:

S142: Fill the first cavity with the material of the second source region 104 to form the second source region 104, and remove the patterned first mask layer, as shown in FIG. 4; In one implementation, B ions are doped in the second source region 104, with a concentration of about 1E21 cm$^{-3}$;

S143: Form a patterned second mask layer; the patterned second mask layer covers the surface of the second source region 104, the dummy gate structure 115, and the sidewall 114;

S144: Fill the second cavity with the material of the second drain region 105 to form the second drain region 105, and remove the patterned second mask layer. The second patterned mask layer and the first patterned mask layer are photoresist 116, as shown in FIG. 5;

In one implementation, the material of the second source region 104 and the second drain region 105 is: SiGe or Si:C;

Wherein, because the second source region 104 and the second drain region 105 of the device adopt SiGe/Si:C epitaxy, it is beneficial to increase the band-to-band tunneling probability of the channel material.

In one implementation, As ions are doped in the second drain region 105, with a concentration of about 1E18 cm$^{-3}$.

S15: Form the first source region 102 and the first drain region 103; the first source region 102 and the first drain region 103 are respectively formed at the top of the second source region 104 and the second drain region 105;

In one implementation, the method used to form the second source region 104 or the second drain region 105 is: in-situ epitaxy, atomic layer deposition, or chemical vapor deposition.

In one implementation, the method for heavily doping the first source region 102 or the second source region 104 is selected from the following methods: in-situ doping method, ion implantation method, or solid source doping method;

In one implementation, the material of the first source region 102 and the first drain region is: SiGe or Si:C.

Because the first source region 102 and the first drain region 103 of the device adopt SiGe/Si:C epitaxy, it will further apply stress to the surrounding gate nanowires/nanosheets, which is beneficial for increasing the carrier mobility of the channel material. In a specific embodiment, the first source region 102 and the first drain region 103 are in-situ doped with As ions, with a concentration of about 1E21 cm$^{-3}$;

After ion doping, it also includes performing a rapid high-temperature annealing and activate the implanted impurities (1050° C., 10s).

S16: Remove the dummy gate structure 115;

S17: Form the gate dielectric layer 107, the control gate 108, the source metal layer 111, the gate metal layer 110, the drain metal layer 109, the interlayer dielectric layer 112, and the metal contact layer 113. Specifically, the material of the gate dielectric layer is: SiO2, Si3N4, or high-k gate dielectric material; the material of the control gate 108 is selected from doped polysilicon, metal cobalt, nickel, and other metals or metal silicides. The growth methods of the gate dielectric layer material include conventional thermal oxidation, nitrogen-doped thermal oxidation, atomic layer deposition, or chemical vapor deposition. In a specific embodiment, the material of the gate dielectric layer is HfO$_2$, with a thickness of 1-5 nm; the gate material is a TiN layer with a thickness of 50-200 nm;

Furthermore, according to one embodiment of the present invention, an electronic device is also provided, including the fin field-effect transistor device with hybrid conduction mechanism described in any one of the above-mentioned embodiments of the present invention.

Additionally, according to one embodiment of the present invention, a method for fabricating an electronic device is provided, including a fabrication method for the fin field-effect transistor device with hybrid conduction mechanism described in any one of the above-mentioned embodiments of the present invention.

Finally, it should be noted that the above embodiments are only used to illustrate the technical solutions of the present invention, and are not intended to limit the scope of the present invention; although detailed descriptions have been provided for the above embodiments, those skilled in the art should understand that modifications can still be made to the technical solutions described in the above embodiments, or equivalent substitutions can be made for some or all of the technical features. These modifications or substitutions do not depart from the essence of the corresponding technical solutions of the embodiments of the present invention.

The invention claimed is:

1. A fin field-effect transistor device with hybrid conduction mechanism, including:

a fin field-effect transistor, which includes a substrate, a fin channel region, a first source region and a first drain region; the first source region and the first drain region are arranged along a first direction above the substrate; the fin channel region is formed on the substrate between the first source region and the first drain region; wherein, the first source region and the first drain region are doped with first ions; wherein, the first direction represents the channel direction of the fin field-effect transistor;

a second source region and a second drain region, the second source region is formed between the substrate and the first source region, the second drain region is formed between the substrate and the first drain region; the height of the second source region and the height of the second drain region are not lower than the height of the substrate between the first source region and the first drain region;

wherein, the second drain region is doped with the first ions, the second source region is doped with second ions, and the type of the first ions is different from the type of the second ions.

2. The fin field-effect transistor device with hybrid conduction mechanism according to claim 1, wherein the thickness of the second source region and/or the second drain region is 5 nm-50 nm.

3. The fin field-effect transistor device with hybrid conduction mechanism according to claim 1, wherein the first ions are P-type ions or N-type ions.

4. The fin field-effect transistor device with hybrid conduction mechanism according to claim 1, wherein the second ions are P-type ions or N-type ions.

5. The fin field-effect transistor device with hybrid conduction mechanism according to claim 1, wherein the ion concentration doped in the second source region and/or the second drain region is $1E16$ $cm^{-3}$-$1E22$ $cm^{-3}$.

6. The fin field-effect transistor device with hybrid conduction mechanism according to claim 1, wherein the material of the second source region and the material of the second drain region are binary or ternary compounds of group II-VI, group III-V, or group IV-IV.

7. The fin field-effect transistor device with hybrid conduction mechanism according to claim 6, wherein the material of the second source region and the material of the second drain region are Si, SiGe or Ge.

8. The fin field-effect transistor device with hybrid conduction mechanism according to claim 1, wherein the fin field-effect transistor further includes:

a gate dielectric layer and a control gate, the gate dielectric layer wraps part of the surface of the channel layer, and wraps the substrate between the first source region and the first drain region; the control gate wraps the surface of the gate dielectric layer;

a sidewall, formed on both sides of the gate dielectric layer and the control gate along the first direction;

a source metal layer, a gate metal layer, and a drain metal layer; the source metal layer and the drain metal layer are respectively formed on the surfaces of the first source region and the first drain region, and fully wrapped the first source region and the second source region, and the first drain region and the second source region, respectively; the gate metal layer is formed at the top of the control gate;

a interlayer dielectric layer, covering the surfaces of the source metal layer, the gate metal layer, the drain metal layer, and the sidewall;

a metal contact layer, penetrating the interlayer dielectric layer, and is respectively connected to the source metal layer, the gate metal layer, and the drain metal layer.

9. A method for manufacturing a fin field-effect transistor device with hybrid conduction mechanism, which is used for manufacturing the fin field-effect transistor device with hybrid conduction mechanism according to claim 1, the method includes:

forming the fin field-effect transistor, the second source region, and the second drain region; wherein, the fin field-effect transistor includes the substrate, the fin channel region, the first source region and the first drain region; the first source region and the first drain region are arranged along the first direction above the substrate; the fin channel region is formed on the substrate between the first source region and the first drain region; the second source region is formed between the substrate and the first source region, the second drain region is formed between the substrate and the first drain region, wherein, the first source region, the first drain region, and the second drain region are doped with the first ions; the second source region is doped with second ions, and the type of the first ions is different from the type of the second ions.

10. The method for manufacturing a fin field-effect transistor device with hybrid conduction mechanism according to claim 9, wherein the forming the fin field-effect transistor, the second source region and the second drain region, specifically includes:

providing the substrate;

forming a dummy gate structure and the sidewall; the dummy gate structure straddles the substrate; the sidewall are closely attached to the two sides of the dummy gate structure along the first direction;

etching the substrate on both sides of the sidewall along the first direction to form the fin channel region, and over-etching the substrate on both sides of the sidewall along the first direction to form a first cavity and a second cavity; wherein, the dummy gate structure and the sidewall wrap the fin channel region; the first cavity and the second cavity are arranged in sequence along the first direction;

forming the second source region and the second drain region; the second source region is formed in the first cavity, and the second drain region is formed in the second cavity;

forming the first source region and the first drain region; the first source region and the first drain region are respectively formed at the top ends of the second source region and the second drain region;

removing the dummy gate structure;

forming the gate dielectric layer, the control gate, the source metal layer, the gate metal layer, the drain metal layer, the interlayer dielectric layer, and the metal contact layer.

11. The method for manufacturing a fin field-effect transistor device with hybrid conduction mechanism according to claim 10, wherein the forming the second source region and the second drain region, specifically includes:

forming a patterned first mask layer; the patterned first mask layer covers the second cavity, the dummy gate structure, and the surface of the sidewall;

filling the material of the second source region in the first cavity to form the second source region, and then removing the patterned first mask layer;

forming a patterned second mask layer; the patterned second mask layer covers the second source region, the dummy gate structure, and the surface of the sidewall;

filling the material of the second drain region in the second cavity to form the second drain region, and then removing the patterned second mask layer.

12. The method for manufacturing a fin field-effect transistor device with hybrid conduction mechanism according to claim 9, wherein the thickness of the second source region and/or the second drain region is 5 nm-50 nm.

13. The method for manufacturing a fin field-effect transistor device with hybrid conduction mechanism according to claim 9, wherein the first ions are P-type ions or N-type ions.

14. The method for manufacturing a fin field-effect transistor device with hybrid conduction mechanism according to claim 9, wherein the second ions are P-type ions or N-type ions.

15. The method for manufacturing a fin field-effect transistor device with hybrid conduction mechanism according to claim 9, wherein the ion concentration doped in the second source region and/or the second drain region is $1E16$ $cm^{-3}$-$1E22$ $cm^{-3}$.

16. The method for manufacturing a fin field-effect transistor device with hybrid conduction mechanism according to claim 9, wherein the material of the second source region and the material of the second drain region are binary or ternary compounds of group II-VI, group III-V, or group IV-IV.

17. The method for manufacturing a fin field-effect transistor device with hybrid conduction mechanism according to claim 9, wherein the material of the second source region and the material of the second drain region are Si, SiGe or Ge.

18. An electronic device, comprising the fin field-effect transistor device with hybrid conduction mechanism according to claim 1.

19. The electronic device according to claim 18, wherein the thickness of the second source region and/or the second drain region is 5 nm-50 nm.

20. The electronic device according to claim 18, wherein the fin field-effect transistor further includes:

a gate dielectric layer and a control gate, the gate dielectric layer wraps part of the surface of the channel layer, and wraps the substrate between the first source region and the first drain region; the control gate wraps the surface of the gate dielectric layer;

a sidewall, formed on both sides of the gate dielectric layer and the control gate along the first direction;

a source metal layer, a gate metal layer, and a drain metal layer; the source metal layer and the drain metal layer are respectively formed on the surfaces of the first source region and the first drain region, and fully wrapped the first source region and the second source region, and the first drain region and the second source region, respectively; the gate metal layer is formed at the top of the control gate;

a interlayer dielectric layer, covering the surfaces of the source metal layer, the gate metal layer, the drain metal layer, and the sidewall;

a metal contact layer, penetrating the interlayer dielectric layer, and is respectively connected to the source metal layer, the gate metal layer, and the drain metal layer.

* * * * *